US011156567B2

United States Patent
Kaneko

(10) Patent No.: US 11,156,567 B2
(45) Date of Patent: Oct. 26, 2021

(54) DEFECT INSPECTION APPARATUS, METHOD, AND PROGRAM

(71) Applicant: FUJIFILM Corporation, Tokyo (JP)

(72) Inventor: Yasuhiko Kaneko, Tokyo (JP)

(73) Assignee: FUJIFILM Corporation, Tokyo (JP)

( * ) Notice: Subject to any disclaimer, the term of this patent is extended or adjusted under 35 U.S.C. 154(b) by 569 days.

(21) Appl. No.: 16/015,598

(22) Filed: Jun. 22, 2018

(65) Prior Publication Data

US 2018/0299388 A1 Oct. 18, 2018

Related U.S. Application Data

(63) Continuation of application No. PCT/JP2016/084902, filed on Nov. 25, 2016.

(30) Foreign Application Priority Data

Jan. 29, 2016 (JP) .............................. JP2016-015667

(51) Int. Cl.
*G01N 23/18* (2018.01)
*G01N 21/88* (2006.01)
(Continued)

(52) U.S. Cl.
CPC .......... *G01N 23/18* (2013.01); *G01N 21/8851* (2013.01); *G01N 23/203* (2013.01);
(Continued)

(58) Field of Classification Search
CPC ... G01N 23/18; G01N 21/8851; G01N 23/203
See application file for complete search history.

(56) References Cited

U.S. PATENT DOCUMENTS

| 5,455,777 A | 10/1995 | Fujiyama et al. |
| 2006/0274933 A1 | 12/2006 | Obara et al. |

(Continued)

FOREIGN PATENT DOCUMENTS

| JP | 6-180281 A | 6/1994 |
| JP | 8-044421 A | 2/1996 |

(Continued)

OTHER PUBLICATIONS

International Preliminary Report on Patentability dated Oct. 31, 2017 issued from the International Bureau in counterpart International Application No. PCT/JP2016/084902.
(Continued)

*Primary Examiner* — Lisa E Peters
(74) *Attorney, Agent, or Firm* — Sughrue Mion, PLLC

(57) ABSTRACT

There are provided a defect inspection apparatus, method, and program for, in a case of using an image of an inspection-target industrial product (test object) to conduct an inspection to check whether defects are present, allowing an image interpreter to precisely and efficiently detect defects. A possible-defect image D3 indicating a crack-like defect and a simulation result image P3 indicating the predicted growth of the crack-like defect are displayed. Sliders L1 and L2 and checkboxes CB1 are used to enable selection of possible defects and simulation results to be displayed. An image interpreter can use the checkboxes CB1 to select a type of possible defect to be displayed, and can use the sliders L1 and L2 to select possible defects to be displayed on the basis of the wall thickness of portions in which possible defects are detected and the size of possible defects.

21 Claims, 11 Drawing Sheets

(51) Int. Cl.
*G01N 23/203* (2006.01)
*G05B 19/042* (2006.01)
*G05B 19/418* (2006.01)
*G06F 30/20* (2020.01)

(52) U.S. Cl.
CPC ..... *G05B 19/042* (2013.01); *G05B 19/41875* (2013.01); *G01N 2021/8887* (2013.01); *G05B 2219/45233* (2013.01); *G06F 30/20* (2020.01)

(56) References Cited

U.S. PATENT DOCUMENTS

| | | | |
|---|---|---|---|
| 2008/0034258 A1* | 2/2008 | Moriya | G05B 23/0297 714/57 |
| 2010/0004875 A1 | 1/2010 | Urano et al. | |
| 2011/0123094 A1* | 5/2011 | Okada | G01N 21/95607 382/149 |
| 2011/0262026 A1 | 10/2011 | Hori | |
| 2011/0311126 A1* | 12/2011 | Sakai | G01N 21/95607 382/149 |
| 2015/0204799 A1 | 7/2015 | Cipriany et al. | |
| 2016/0320352 A1* | 11/2016 | Mizota | G01N 29/4472 |

FOREIGN PATENT DOCUMENTS

| | | |
|---|---|---|
| JP | 11-110036 A | 4/1999 |
| JP | 2001-156135 A | 6/2001 |
| JP | 2004-239728 A | 8/2004 |
| JP | 2007-24835 A | 2/2007 |
| JP | 2010-14635 A | 1/2010 |
| JP | 2010-272528 A | 12/2010 |
| JP | 2011-232111 A | 11/2011 |
| JP | 2011-252846 A | 12/2011 |
| JP | 2014-182113 A | 9/2014 |
| WO | WO-2013015013 A1 * | 1/2013 ........... G01N 21/952 |

OTHER PUBLICATIONS

Written Opinion dated Feb. 21, 2017 from the International Searching Authority in counterpart application No. PCT/JP2016/084902.
International Search Report in application No. PCT/JP2016/084902 dated Feb. 21, 2017.

* cited by examiner

DEFECT INSPECTION APPARATUS, METHOD, AND PROGRAM

CROSS REFERENCE TO RELATED APPLICATIONS

This application is a Continuation of PCT International Application No. PCT/JP2016/084902 filed on Nov. 25, 2016, which claims priority under 35 U.S.C § 119(a) to Patent Application No. 2016-015667 filed in Japan on Jan. 29, 2016, all of which are hereby expressly incorporated by reference into the present application.

BACKGROUND OF THE INVENTION

1. Field of the Invention

The present invention relates to a defect inspection apparatus, method, and program and specifically relates to a defect inspection apparatus, method, and program for providing assistance in inspecting defects using an image of an inspection-target industrial product.

2. Description of the Related Art

JP-2011-252846A discloses a remaining-life diagnostic apparatus for diagnosing the remaining life of an inspection target relating to a power facility.

JP2010-272528A discloses an inspection apparatus and method for inspecting the surface of a sample. JP2010-272528A discloses a technique in which, for example, a simulation experiment is used as appropriate to predict a portion having a large number of defects (paragraph <0201>).

SUMMARY OF THE INVENTION

In a case where an accident has once occurred in a facility, such as a pipeline, used to, for example, carry oils, the accident causes serious damage to society. It is difficult to remove a facility, such as a pipeline, for inspection, and therefore, a facility, such as a pipeline, is usually inspected by using a nondestructive inspection that involves irradiation of an inspection target, such as a pipeline, with light rays or radiation rays. In a nondestructive inspection, an image of an inspection target, such as a pipeline, obtained by irradiating the pipeline with light rays or radiation rays is interpreted by an image interpreter to check defects. In an inspection, various types of defects are detected, such as stains, cracks, dust, and chipping, which vary in form and size, and furthermore, a considerable number of defects are detected. Therefore, it takes a considerable time to exhaustively check these defects. Accordingly, it is required to increase precision and efficiency in interpretation of an image and checking of defects; however, JP-2011-252846A or JP2010-272528A does not disclose a technique for increasing efficiency in interpretation of an image of an inspection target.

The present invention has been made in view of the above-described circumstances, and an object thereof is to provide a defect inspection apparatus, method, and program for, in a case of using an image of an inspection-target industrial product (hereinafter referred to as a test object) to conduct an inspection to check whether defects are present, allowing an image interpreter to precisely and efficiently detect defects.

To address the issues described above, a defect inspection apparatus according to a first aspect of the present invention includes: image obtaining means for obtaining a received-light image created on the basis of reflected light or transmitted light from a test object, the reflected light or the transmitted light being obtained as a result of irradiation of the test object with light rays or radiation rays; image processing means for calculating a position and features of each of possible defects in the test object from the received-light image; saving means for saving a calculation result, which includes the position and the features of each of the possible defects, obtained by the image processing means and a diagnosis result indicating whether each of the possible defects is a defect in association with the calculation result; simulation means for analyzing an occurrence and growth of the defect over time from the calculation result obtained by the image processing means and saved on the saving means and the diagnosis result saved on the saving means, and conducting a simulation for predicting growth of each of the possible defects; display means for displaying the received-light image; and display control means for causing the calculation result obtained by the image processing means and a simulation result obtained by the simulation means to be selectively displayed on the received-light image.

According to the first aspect, the result of simulation for predicting the growth of a detected possible defect can be displayed. Accordingly, an image interpreter can check the occurrence of possible defects and information regarding the growth and spreading thereof over time on a screen, and therefore, precision and efficiency in image interpretation can be increased, and efforts made by the image interpreter can be reduced.

In a second aspect of the present invention, the defect inspection apparatus according to the first aspect further includes defect occurrence information obtaining means for obtaining defect occurrence information indicating occurrences of defects in the past in the test object. The display control means causes the defect occurrence information to be selectively displayed on the received-light image in addition to the calculation result and the simulation result.

According to the second aspect, the image interpreter can also check the occurrence of defects in the past, and therefore, precision and efficiency in image interpretation can be further increased, and efforts made by the image interpreter can be reduced.

In a third aspect of the present invention, in the defect inspection apparatus according to the second aspect, the defect occurrence information obtaining means obtains the defect occurrence information, which includes position information regarding portions in which the defects occurred in the past and frequency information regarding a defect occurrence frequency in each of the portions; and the display control means causes the frequency information to be displayed on the received-light image in a case of displaying the defect occurrence information.

According to the third aspect, the image interpreter can also check the defect occurrence frequency in the past, and therefore, precision and efficiency in image interpretation can be further increased, and efforts made by the image interpreter can be reduced.

In a fourth aspect of the present invention, in the defect inspection apparatus according to the second or third aspect, the defect occurrence information obtaining means obtains defect occurrence information that corresponds to a product of a type identical to a type of the test object and defect occurrence information that corresponds to a product having a technical classification similar to a technical classification of the test object in addition to the defect occurrence information corresponding to the test object; and the display control means causes the obtained defect occurrence information to be selectively displayed on the received-light image.

In a fifth aspect of the present invention, in the defect inspection apparatus according to the fourth aspect, the simulation means analyzes the occurrence and growth of the defect over time from a calculation result and a diagnosis result corresponding to the product of the type identical to the type of the test object in addition to the calculation result and the diagnosis result corresponding to the test object, and conducts a simulation.

In a sixth aspect of the present invention, the defect inspection apparatus according to any one of the first to fifth aspects further includes operation means for accepting an operation of continuously or gradually changing specification of a feature range of a possible defect to be displayed on the display means, and causing, in accordance with the operation, only a possible defect that falls within the feature range among the possible defects for which calculation is performed by the image processing means to be displayed on the received-light image displayed on the display means.

According to the sixth aspect, with the operation means, specification of the feature range of a possible defect to be displayed on the display means can be continuously or gradually changed, and therefore, precision and efficiency in defect detection can be further increased.

In a seventh aspect of the present invention, in the defect inspection apparatus according to the sixth aspect, the operation means causes the display means to display, for each of the features of the possible defects, a slider bar for displaying a result of specification for the feature, and accepts an operation of moving a slider on the slider bar to thereby continuously or gradually change specification of the feature range.

According to the seventh aspect, with the use of the slider bar, specification of the feature range of a possible defect to be displayed on the display means can be continuously or gradually changed, and therefore, precision and efficiency in defect detection can be further increased.

In an eighth aspect of the present invention, in the defect inspection apparatus according to the seventh aspect, the display means displays a frequency distribution indicating a detection frequency for each of the features of the possible defects in association with the slider bar.

According to the eighth aspect, with the frequency distribution (for example, a histogram), the image interpreter can recognize the detection frequency for each of the features of the possible defects and can operate the slider bar with reference to the detection frequency, and therefore, the image interpreter can efficiently operate the slider bar.

In a ninth aspect of the present invention, in the defect inspection apparatus according to any one of the first to eighth aspects, the diagnosis result includes at least one of an inspection date and time or a material of the test object, a type, a form, a magnitude, a depth, or a site of occurrence of the defect, or an image of the defect.

A defect inspection method according to a tenth aspect of the present invention includes: an image obtaining step of obtaining a received-light image created on the basis of reflected light or transmitted light from a test object, the reflected light or the transmitted light being obtained as a result of irradiation of the test object with light rays or radiation rays; an image processing step of calculating a position and features of each of possible defects in the test object from the received-light image; a saving step of saving, on saving means of a defect inspection apparatus, a calculation result, which includes the position and the features of each of the possible defects, obtained in the image processing step and a diagnosis result indicating whether each of the possible defects is a defect in association with the calculation result; a simulation step of analyzing an occurrence and growth of the defect over time from the calculation result obtained in the image processing step and saved on the saving means and the diagnosis result saved on the saving means, and conducting a simulation for predicting growth of each of the possible defects; and a display control step of causing the calculation result obtained in the image processing step and a simulation result obtained in the simulation step to be selectively displayed on the received-light image displayed on display means of the defect inspection apparatus.

A non-transitory computer readable recording medium storing a defect inspection program according to an eleventh aspect of the present invention causes a computer to execute a function including: an image obtaining function of obtaining a received-light image created on the basis of reflected light or transmitted light from a test object, the reflected light or the transmitted light being obtained as a result of irradiation of the test object with light rays or radiation rays; an image processing function of calculating a position and features of each of possible defects in the test object from the received-light image; a saving function of saving a calculation result, which includes the position and the features of each of the possible defects, obtained by the image processing function and a diagnosis result indicating whether each of the possible defects is a defect in association with the calculation result; a simulation function of analyzing an occurrence and growth of the defect over time from the saved calculation result and the saved diagnosis result, and conducting a simulation for predicting growth of each of the possible defects; and a display control function of causing the calculation result and a simulation result obtained by the simulation function to be selectively displayed on the received-light image.

According to the present invention, the result of simulation for predicting the growth of a detected possible defect can be displayed. According to the present invention, an image interpreter can check the occurrence of possible defects and information regarding the growth and spreading thereof over time on a screen on the basis of, for example, the history of defects detected in the past, and therefore, precision and efficiency in image interpretation can be increased, and efforts made by the image interpreter can be reduced. Furthermore, according to the present invention, specification of the feature range of a possible defect to be displayed on the display means can be continuously or gradually changed, and therefore, precision and efficiency in defect detection can be increased.

DESCRIPTION OF THE PREFERRED EMBODIMENTS

Hereinafter, a defect inspection apparatus, method, and non-transitory computer readable recording medium storing a program according to an embodiment of the present invention will be described with reference to the attached drawings.

Configuration of Defect Inspection Apparatus

Figure 1:
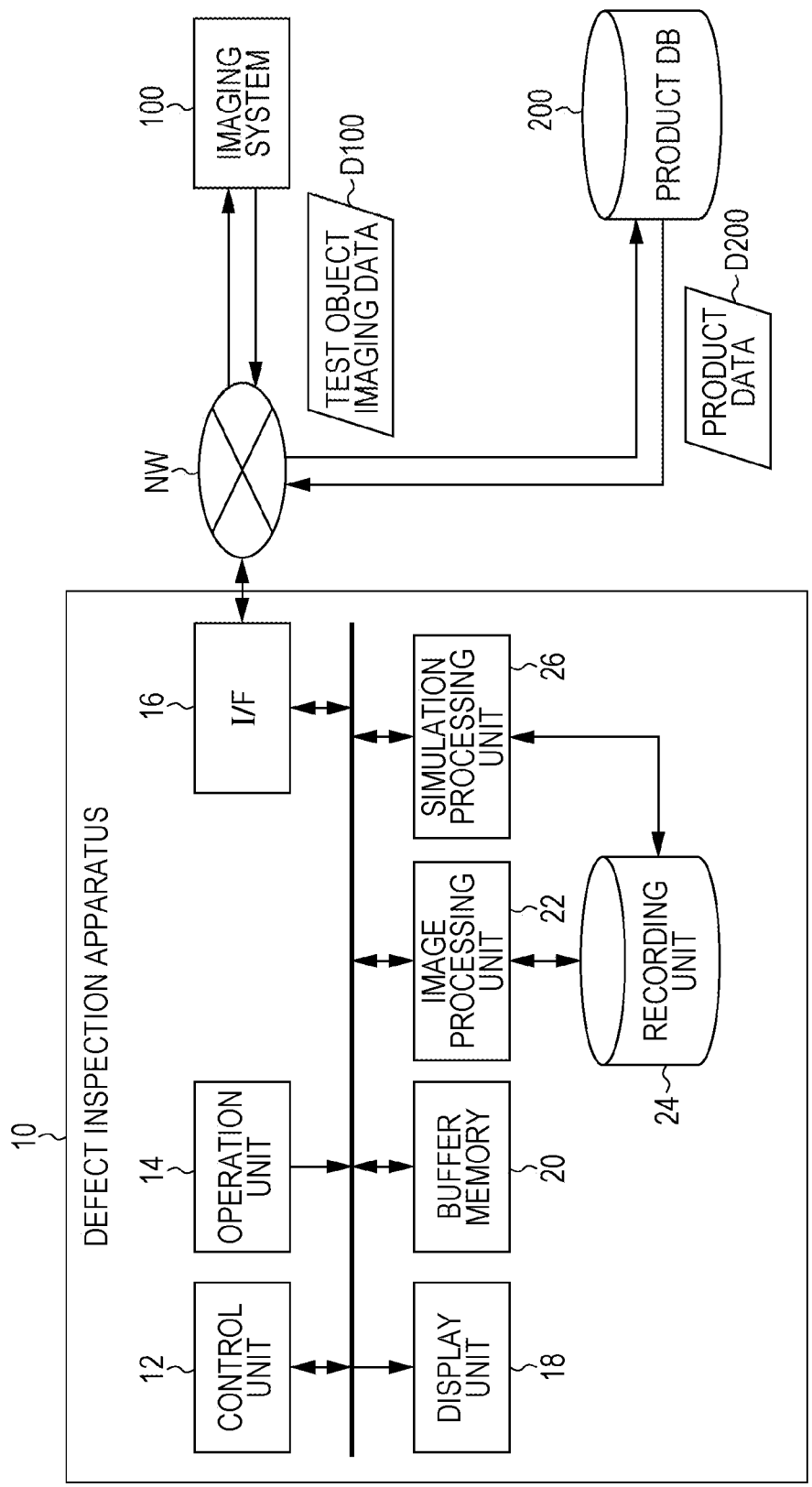
FIG. 1 is a block diagram illustrating a defect inspection apparatus according to an embodiment of the present invention.

FIG. 1 is a block diagram illustrating a defect inspection apparatus according to an embodiment of the present invention.

A defect inspection apparatus 10 according to this embodiment is an apparatus that detects possible defects from a captured image of an inspection-target industrial product (test object) and displays the possible defects, and is an apparatus for assisting an image interpreter in diagnosing a defect in the test object. As illustrated in FIG. 1, the defect inspection apparatus 10 according to this embodiment includes a control unit 12, an operation unit 14, an input/output interface (hereinafter referred to as an I/F (interface)) 16, a display unit 18, a buffer memory 20, an image processing unit 22, a recording unit 24, and a simulation processing unit 26.

The control unit 12 (display control means) includes a CPU (central processing unit) that controls the operations of the units of the defect inspection apparatus 10. The control unit 12 accepts an operation input by an image interpreter via the operation unit 14 and transmits a control signal corresponding to the input operation to the units of the defect inspection apparatus 10 to control the operations of the units.

The operation unit (operation means) 14 is an input device that accepts an operation input by an image interpreter, and includes a keyboard for inputting characters and a pointing device (for example, a mouse or a trackball) for operating, for example, pointers and icons displayed on the display unit 18. Note that, as the operation unit 14, a touch panel can be provided on the surface of the display unit 18 in place of the devices listed above or in addition to the devices listed above.

The I/F 16 is means for communication with an external apparatus via a network NW. As a method for data transmission/reception between the defect inspection apparatus 10 and an external apparatus, wired communication (for example, a LAN (local area network), a WAN (wide area network), or Internet connection) or wireless communication (for example, a LAN, a WAN, or Internet connection) can be used.

The defect inspection apparatus 10 can accept test object imaging data D100, which includes captured image data of a test object OBJ imaged by an imaging system 100 and is input via the I/F (image obtaining means, defect occurrence information obtaining means) 16. Note that a method for inputting the test object imaging data D100 from the imaging system 100 to the defect inspection apparatus 10 is not limited to the communication listed above performed via the network NW. For example, the defect inspection apparatus 10 and the imaging system 100 may be connected to each other via, for example, a USB (Universal Serial Bus) cable, Bluetooth (registered trademark), or infrared communication. The test object imaging data D100 may be stored in a memory card that is mountable on and readable by the defect inspection apparatus 10, and the image data may be input to the defect inspection apparatus 10 via the memory card.

Furthermore, the defect inspection apparatus 10 can communicate with a product database (product DB) 200 via the network NW. In the product DB 200, product data D200 for each industrial product that can be an inspection target is stored. The control unit 12 can retrieve and read, from test object imaging data of the test object OBJ obtained from the imaging system 100, test object identification information for identifying the test object and obtain the product data D200 that corresponds to the read test object identification information from the product DB 200. When the product data D200 is used, possible defects in the test object OBJ can be detected in accordance with types or features.

Note that the product DB 200 may be placed on the network NW as in this embodiment to allow, for example, the manufacturer to update the product data D200, or may be provided in the defect inspection apparatus 10.

The display unit (display means) 18 is a device for displaying images. As the display unit 18, for example, a liquid crystal monitor (see FIG. 5) can be used.

The buffer memory 20 is used as a work area of the control unit 12 and an area for temporarily storing image data to be output to the display unit 18.

The recording unit (saving means) 24 is means for storing data including a control program used by the control unit 12.

As the recording unit 24, for example, a device, such as a magnetic disk, namely, an HDD (hard disk drive) or the like, or a device, such as a flash memory, namely, an eMMC (embedded Multi Media Card), an SSD (solid state drive), or the like, can be used. On the recording unit 24, the test object imaging data D100 and the product data D200 are stored.

The image processing unit (image processing means) 22 reads captured image data of the test object OBJ from the test object imaging data D100, performs image processing on the captured image data, and detects possible defects. The image processing unit 22 outputs the captured image data and pieces of possible-defect information indicating detection results (feature calculation results) of the detected possible defects to the buffer memory 20. The control unit 12 uses the data output to the buffer memory 20 to create a display image obtained by adding the pieces of possible-defect information to the captured image data and causes the display unit 18 to display the display image. Accordingly, an image interpreter can interpret the image displayed on the display unit 18 to inspect the test object OBJ.

The image interpreter can input, via the operation unit 14, a diagnosis result stating that, for example, "immediately replace the test object OBJ with a new one", "watch and wait (conduct a re-inspection a days after)", or "leave (not a defect)" for each piece of possible-defect information added to the image displayed on the display unit 18. The control unit 12 creates and stores on the recording unit 24 test object inspection result data D10 (see FIG. 3C), which includes the above-described diagnosis result data.

Figure 2:
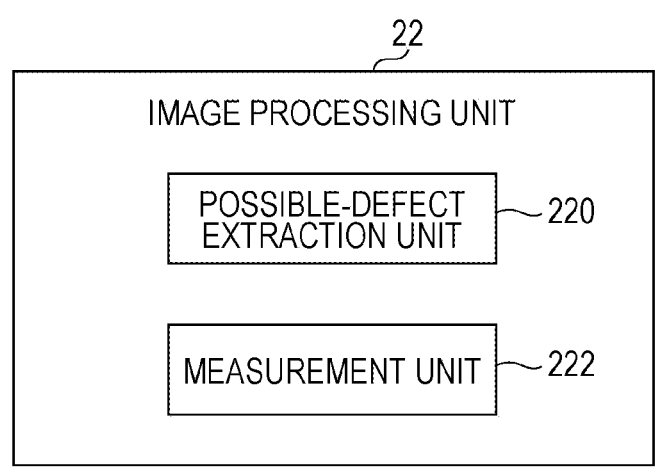
FIG. 2 is a block diagram illustrating an example of an image processing unit of the defect inspection apparatus according to an embodiment of the present invention.

FIG. 2 is a block diagram illustrating an example of the image processing unit. As illustrated in FIG. 2, the image processing unit 22 includes a possible-defect detection unit 220 and a measurement unit 222.

The possible-defect detection unit 220 performs image processing (for example, color conversion processing, monochrome conversion processing, edge enhancement processing, or 3D-data conversion processing) on captured image data to detect changes in, for example, the color of the test object OBJ, thereby detecting possible defects (for example, flaws, cracks, wear, and rust) in the test object OBJ. Accordingly, the position and form of each possible defect are identified.

Note that, for example, product image data including an image of a (new) product that is identical to the test object OBJ and has no detected defects may be included in the product data D200, and the product image data may be compared with the captured image data of the test object OBJ to detect possible defects.

The measurement unit 222 measures the dimensions of each part of the test object OBJ on the basis of the captured image data of the test object OBJ and imaging condition data. The measurement unit 222 measures the size of the test object OBJ on the basis of the imaging condition data, which includes the distance between the camera and the test object OBJ, the focal length, and the zoom magnification at the time of imaging, and the magnitude of the test object OBJ in the captured image data. The measurement unit 222 uses the measured size of the test object OBJ and the magnitude of the test object OBJ and the magnitude of each possible defect in the captured image data to calculate the size of the possible defect (for example, the maximum dimensions, the minimum dimensions, or the depth and angle of a crack). Note that the size of the test object OBJ may be obtained from the product data D200.

Furthermore, the measurement unit 222 uses the dimensions of each part of the test object OBJ and information indicating, for example, the reflectance and light transmittance (transmission attenuation) of irradiation light at the time of imaging of the test object OBJ to measure the wall thickness of the test object OBJ at each position. Note that the wall thickness may be measured by the imaging system 100 at the time of imaging and included in the test object imaging data D100.

The simulation processing unit (simulation means) 26 uses the test object imaging data D100 and the product data D200 to analyze the occurrence and growth of a defect over time and conduct a simulation for predicting the growth of a possible defect. For a granular defect or a stain-like defect, the degree of spreading and the direction of spreading of the defect are calculated on the basis of, for example, the size and wall thickness of the test object OBJ. For a crack-like defect, changes in the length and depth and the direction of extension are calculated on the basis of, for example, the size and wall thickness of the test object OBJ. For example, a simulation is conducted under the assumption that, a defect having a larger size or a crack-like defect extending deeper grows quickly (the defect spreads or extends to a large degree per unit time). A simulation is conducted under the assumption that a defect in the test object OBJ formed of a hard material or a flexible material grows more slowly (the defect spreads or extends to a smaller degree per unit time) than a defect in the test object OBJ formed of a brittle material. Furthermore, a simulation is conducted by taking into consideration the wall thickness of a part surrounding a possible defect under the assumption that a defect for which a surrounding part has a small wall thickness grows more quickly (the defect spreads and extends to a larger degree per unit time) than a defect for which a surrounding part has a large wall thickness.

In a simulation, the use of the test object OBJ and the form of installation thereof can be taken into consideration. For example, it is preferable to conduct a simulation under the assumption that a defect grows more quickly (spreads and extends to a larger degree per unit time) in a case of the use in a movable part or a vibrating part and in a case of the use in a place where a load (stress) is put than in the other cases.

Figure 3A:
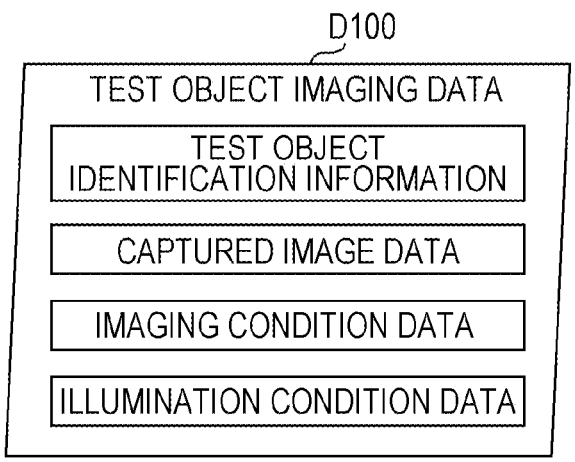
FIG. 3A is a block diagram illustrating an example of test object imaging data.

FIG. 3A is a block diagram illustrating an example of the test object imaging data. As illustrated in FIG. 3A, the test object imaging data D100 includes test object identification information, captured image data, imaging condition data, and illumination (irradiation) condition data.

The test object identification information is information for identifying the test object OBJ and includes information indicating, for example, the product name, the product number, the manufacturer's name, and the technical classification of the test object OBJ.

The captured image data is image data (for example, an X-ray image or a visible-light image) obtained by imaging the test object OBJ.

The imaging condition data is stored for each piece of captured image data of the test object OBJ and includes information indicating the imaging date and time of the piece of captured image data, the imaging target portion, and the distance between the test object OBJ and the camera and the angle relative to the camera at the time of imaging.

The illumination (irradiation) condition data includes information indicating the type of radiation (for example, X rays, visible rays, transmitted rays, or reflected rays) used to image the test object OBJ, the strength of irradiation, and the angle of irradiation.

Figure 3B:
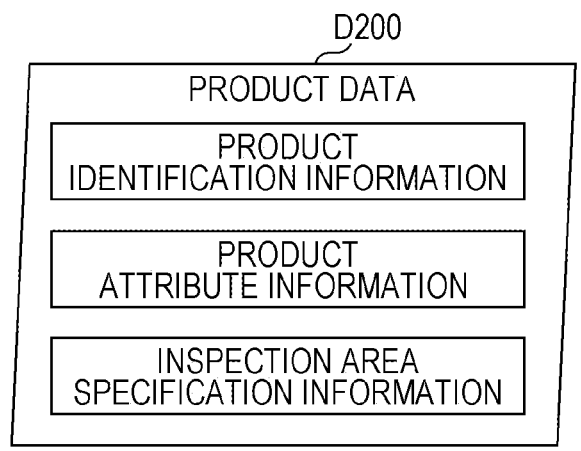
FIG. 3B is a block diagram illustrating an example of product data.

FIG. 3B is a block diagram illustrating an example of the product data. As illustrated in FIG. 3B, the product data includes product identification information, product attribute information, and inspection area specification information. The product data D200 may be associated with the test object imaging data D100 and the test object inspection result data D10 via the test object identification information and the product identification information and recorded to the recording unit 24, or may be obtained from the product DB 200 each time a defect inspection is conducted.

The product identification information is information for identifying the product and includes information indicating, for example, the product name, the product number, the manufacturer's name, and the technical classification.

The product attribute information includes information indicating, for example, the material and dimensions of each part of the product and the use of the product. The information indicating the use of the product includes information regarding, for example, the name and type of, for example, an apparatus in which the product is installed, and the state of processing and the method for installation (for example, a joint part, a welding part, fastening with screws, fitting, or soldering). The product attribute information further includes defect occurrence information. The defect occurrence information includes at least one piece of information among, for example, a past inspection date and time, the material of the test object OBJ, the type (for example, a foreign object or a crack), position information, form, magnitude, depth, and site of occurrence (coordinates of site) of a defect occurred in the past, the wall thickness of the material, the state of processing (for example, a joint part or a welding part), frequency information regarding the defect occurrence frequency, and a captured image of the defect.

The inspection area specification information includes information indicating an inspection area specified by, for example, the manufacturer of the product (for example, information that includes the position of an inspection area and that is created on the basis of the defect occurrence information including information indicating whether a defect occurred in the past and the frequency information regarding the defect occurrence frequency). The inspection area specification information is created by identifying a portion in which a defect is likely to occur statistically or structurally on the basis of information regarding past repairs of the product by, for example, the manufacturer.

The defect occurrence information includes at least one piece of information among, for example, a past inspection date and time, the material of the test object OBJ, the type (for example, a foreign object or a crack), form, magnitude, depth, and site of occurrence (coordinates of site) of a defect occurred in the past, the wall thickness of the material, the state of processing (for example, a joint part or a welding part), and a captured image of the defect.

In a case of detecting possible defects from the test object OBJ, the image processing unit 22 can increase precision in detection of possible defects for an inspection area specified in the inspection area specification information (for example, decrease the minimum size (size threshold) of, for example, a flaw that is detected as a possible defect or decrease a threshold of the depth of a crack that is detected as a possible defect). When an image of the test object OBJ and images of possible defects are displayed on the display unit 18, the image processing unit 22 may add, for example, a mark for identifying captured image data of the inspection area and a mark for identifying a possible defect detected from a detection target area or may perform processing to emphasize the captured image data and the possible defect.

Note that, for a product having a plurality of uses, inspection area specification information may be created for each of the uses of the product (for example, for each of the types of apparatuses in which the product is installed or for each of the installation places), and possible defects may be detected by using inspection area specification information that corresponds to a specified use.

In a case where product data including a product name or a product number that matches the product name or the product number of the test object OBJ is not present, product data of a product having a technical classification similar to that of the test object OBJ may be obtained and used in image processing.

Figure 3C:
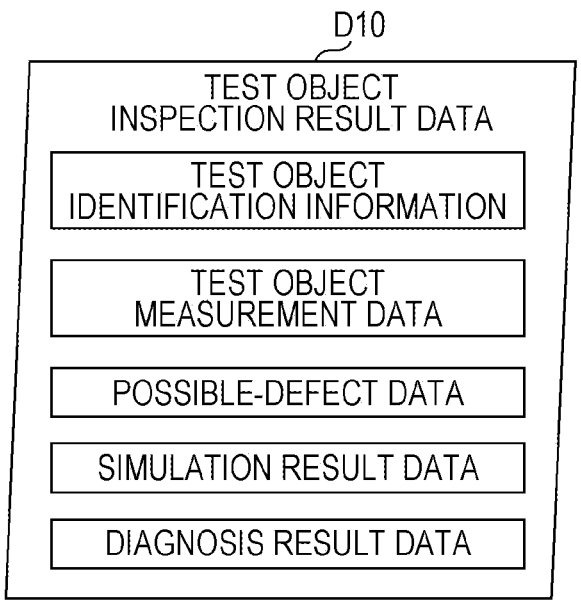
FIG. 3C is a block diagram illustrating an example of test object inspection result data.

FIG. 3C is a block diagram illustrating an example of the test object inspection result data. As illustrated in FIG. 3C, the test object inspection result data D10 includes test object measurement data, possible-defect data, and diagnosis result data in addition to the test object identification information described above. The test object inspection result data D10 is associated with the test object imaging data D100 via the test object identification information and recorded to the recording unit 24.

The test object measurement data includes information indicating the size of the test object OBJ and the wall thickness of the test object OBJ at each position obtained as a result of measurement by the measurement unit 222.

The possible-defect data includes information indicating the features of each possible defect (for example, the position, the size, the amount of change in wall thickness, and the type of each possible defect). The information indicating the position of each possible defect can be represented by, for example, coordinates in a coordinate system (for example, a 3D rectangular coordinate system, a polar coordinate system, or a cylindrical coordinate system) set in accordance with the form of the test object OBJ. The information indicating the type of each possible defect is information created on the basis of the form of the possible defect detected from an image and is information indicating, for example, a granular defect, a stain-like defect, or a crack-like defect.

The simulation result data includes information regarding the result of simulation for predicting the growth of each possible defect detected from the test object OBJ. Specifically, the simulation result data includes possible-defect identification information (for example, position coordinates or a unique identification code that is assigned on a per possible-defect basis) for identifying each possible defect, and information indicating the degree of growth of the possible defect after the use of the test object OBJ for a predetermined period (for example, the degree of spreading of a granular defect or a stain-like defect, the degree of decrease in the wall thickness, or the length and depth of an extending crack).

Note that the simulation result data may include the result of simulation for predicting the growth at a plurality of future time points (for example, n days after, n months after, and so on). Furthermore, a time point for which a simulation is to be conducted to obtain a result may be determined in advance for the type and each of the uses of the industrial product. For example, it is preferable to predict the growth at a larger number of time points at shorter intervals for a part, such as a pipe, that is likely to wear due to the type of a substance flowing therethrough, a part that is used in a portion on which a load is likely to be intensively put, or a part having a portion in which a possible defect is detected and which has a relatively small wall thickness than for a part that is used in a portion on which a load is not put or a part having a portion in which a possible defect is detected and which has a relatively large wall thickness.

The diagnosis result data includes the inspection date and time and information regarding each possible defect additionally input by an image interpreter. The diagnosis result data includes information indicating the result of diagnosis input by the image interpreter stating that, for example, "immediately replace the test object OBJ with a new one", "watch and wait (conduct a re-inspection n days after)", or "leave (not a defect)".

Note that the test object inspection result data D10 may include part of the test object imaging data D100 and the product data D200.

Furthermore, the test object inspection result data D10 may be transmitted and accumulated in the product DB 200, the possible-defect data and the diagnosis result data included in the test object inspection result data D10 may be analyzed, and the inspection area specification information in the product data D200 may be updated by using the result of analysis.

Configuration of Imaging System

Figure 4:
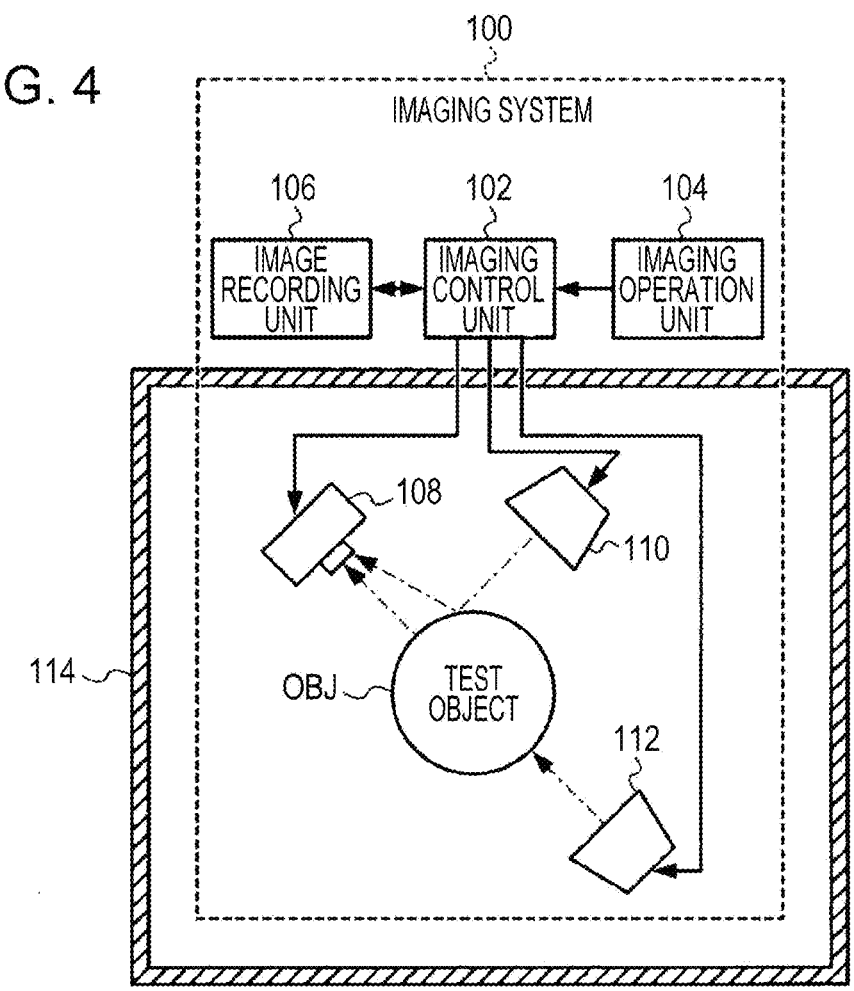
FIG. 4 is a block diagram illustrating an example of an imaging system.

Now, the imaging system 100 for capturing an image of the test object OBJ is described. FIG. 4 is a block diagram illustrating an example of the imaging system.

The imaging system 100 is a system for imaging the test object OBJ placed in an imaging room 114 and includes an imaging control unit 102, an imaging operation unit 104, an image recording unit 106, a camera 108, and radiation sources 110 and 112, as illustrated in FIG. 4.

The imaging control unit 102 includes a CPU (central processing unit) that controls the operations of the units of the imaging system 100. The imaging control unit 102 accepts an operation input by an operator (a person who performs imaging) via the imaging operation unit 104 and transmits a control signal corresponding to the input operation to the units of the imaging system 100 to control the operations of the units.

The imaging operation unit 104 is an input device that accepts an operation input by an operator, and includes a keyboard for inputting characters and a pointing device (for example, a mouse or a trackball) for operating, for example, pointers and icons displayed on the display unit 18. The operator can input information regarding the test object OBJ, input an instruction (including imaging conditions, such as the exposure time, the focal length, and the aperture setting, and settings, such as the angle of imaging and the imaging portion) to be given to the camera 108 for performing imaging, input an instruction (including settings, such as the irradiation start time, the irradiation duration, the angle of irradiation, and the strength of irradiation) to be given to the radiation sources 110 and 112 for irradiation with radiation rays, and input an instruction for recording obtained image data to the image recording unit 106, via the imaging operation unit 104.

The image recording unit 106 records image data (received-light image) of the test object OBJ imaged by the camera 108. To the image recording unit 106, information for identifying the test object OBJ is recorded in association with the image data.

The camera 108 and the radiation sources 110 and 112 are arranged inside the imaging room 114. The radiation sources 110 and 112 are, for example, X-ray sources. The walls between the imaging room 114 and the outside and the door are provided with X-ray protection using an X-ray protective material (for example, lead or concrete). Note that, in a case of imaging by irradiating the test object OBJ with visible light, the imaging room 114 provided with protection need not be used.

The radiation sources 110 and 112 irradiate the test object OBJ placed inside the imaging room 114 with radiation rays in accordance with an instruction from the imaging control unit 102.

The camera 108 receives radiation rays emitted from the radiation source 110 to the test object OBJ and reflected by the test object OBJ or radiation rays emitted from the radiation source 112 to the test object OBJ and passing through the test object OBJ in accordance with an instruction from the imaging control unit 102 for performing imaging to thereby image the test object OBJ. The test object OBJ is held by a holding member not illustrated (for example, a manipulator, a mounting table, or a movable mounting table) inside the imaging room 114, and the distances from the test object OBJ to the camera 108 and to the radiation sources 110 and 112 and the angles of the test object OBJ relative to the camera 108 and to the radiation sources 110 and 112 can be adjusted. An operator can control the relative positions of the test object OBJ, the camera 108, and the radiation sources 110 and 112 and can image a desired portion of the test object OBJ, via the imaging control unit 102.

The radiation sources 110 and 112 stop irradiating the test object OBJ with radiation rays in synchronization with the end of imaging performed by the camera 108.

Note that, in the example illustrated in FIG. 4, the camera 108 is arranged inside the imaging room 114; however, the camera 108 may be arranged outside as long as the test object OBJ inside the imaging room 114 can be imaged.

In the example illustrated in FIG. 4, one camera, namely, the camera 108, and two radiation sources, namely, the radiation sources 110 and 112, are provided; however, the number of cameras and the number of radiation sources are not limited to these. For example, a plurality of cameras and a plurality of radiation sources may be provided, or one camera and one radiation source may be provided.

Display Control for Image of Test Object

Now, examples of display control for an image of a test object according to this embodiment are described.

Figure 5:
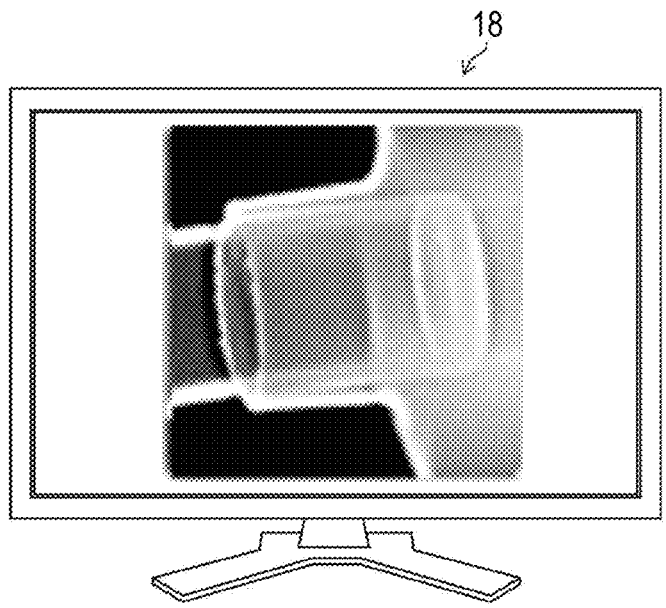
FIG. 5 is a front view illustrating the external appearance of a display unit of the defect inspection apparatus according to an embodiment of the present invention.
Figure 6:
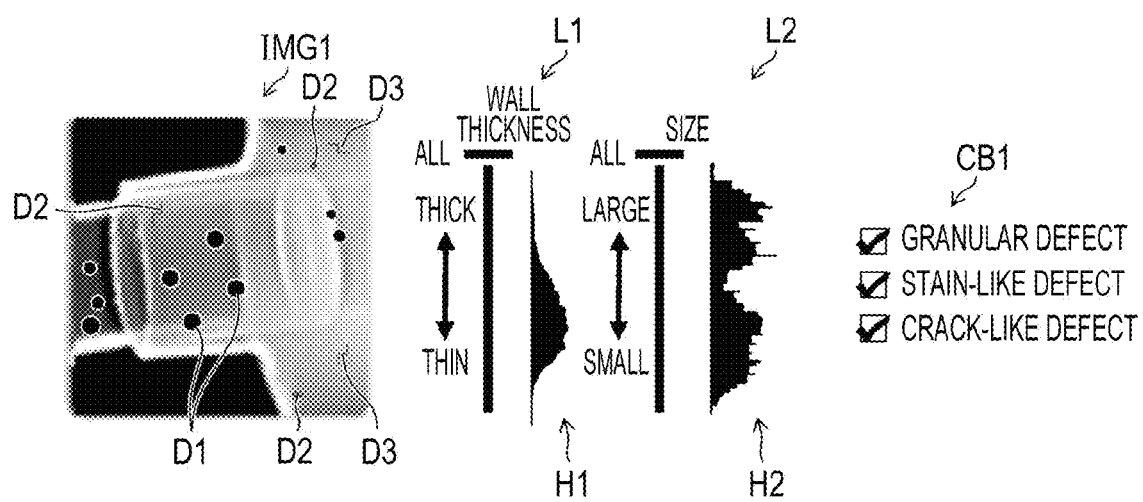
FIG. 6 is a diagram illustrating example display of possible defects.

FIG. 5 is a front view illustrating the external appearance of the display unit of the defect inspection apparatus according to an embodiment of the present invention. FIG. 6 is a diagram illustrating example display of possible defects.

As illustrated in FIG. 6, on the display unit 18, the test object image IMG1 of the test object OBJ and GUIs (graphical user interfaces) for changing display targets are displayed.

To the test object image data IMG1, images that represent possible defects detected by the image processing unit 22 (hereinafter referred to as possible-defect images D1 to D3) are added. The possible-defect images D1 to D3 can be, for example, color-coded and displayed in accordance with the types. In the example illustrated in FIG. 6, as the types of possible defects, three types including "granular defect", "stain-like defect", and "crack-like defect" are presented, which are illustrated as possible defects D1, D2, and D3 respectively. Note that the types of possible defects are not limited to these and, for example, an image interpreter may be allowed to change the settings using the operation unit 14.

The checkboxes CB1 are GUIs for selecting types of defects to be displayed on the test object image IMG1. When the checkboxes CB1 for "granular defect", "stain-like defect", and/or "crack-like defect" are selected by the operation unit 14, the control unit 12 displays only images of possible defects of the one or more selected types on the test object image IMG1. For example, when "granular defect" is selected, only the possible-defect images D1 are displayed on the test object image IMG1, and the possible-defect images D2 and D3 that are displayed are erased. An image interpreter can select one or more types of defects to be displayed from among "granular defect", "stain-like defect", and "crack-like defect" by operating the checkboxes CB1 via the pointing device of the operation unit 14.

The sliders (slider bars) L1 and L2 are GUIs for continuously or gradually changing the wall thickness around a defect and size of a defect to be displayed on the test object image IMG1, respectively. Adjacent to the sliders L1 and L2, the histograms H1 and H2 are respectively displayed. The histogram H1 indicates the frequency distribution of the detection frequency of possible defects for each wall thickness, and the histogram H2 indicates the frequency distribution of the detection frequency of possible defects for each size.

In the example illustrated in FIG. 6, setting is performed to display "all" for both the wall thickness and the size, and possible defects in all portions of the test object OBJ are displayed. When the sliders L1 and L2 are operated (moved) by the operation unit 14, only images of possible defects within a wall thickness range selected by the slider L1 and within a size range selected by the slider L2 are displayed, and images of possible defects outside the ranges are erased.

Note that, in this embodiment, the wall thickness of a portion in which a possible defect is detected and the size of a possible defect are continuously or gradually changed by using the GUIs, namely, the sliders L1 and L2, respectively, to thereby enable selection of possible defects to be displayed; however, this embodiment is not limited to this configuration. For example, a numerical value or a numerical range (hereinafter referred to as a numerical value or the like) indicating a wall thickness or a size input via the operation unit 14 may be accepted, and only possible defects corresponding to the input numerical value or the like may be selectively displayed. In a case of accepting input of a numerical range, an upper limit or a lower limit input via the operation unit 14 may be accepted, and only possible defects corresponding to a wall thickness equal to or lower than the input upper limit or equal to or higher than the input lower limit or only possible defects having a size equal to or lower than the input upper limit or equal to or higher than the input lower limit need to be displayed.

Furthermore, numerical values or numerical ranges specified by the sliders L1 and L2 may be displayed together with the sliders L1 and L2 of this embodiment. In a case of displaying the sliders L1 and L2 and the numerical values or the like together, the numerical values or the like to be displayed may be updated by the control unit 12 in accordance with operations of the sliders L1 and L2, or the sliders L1 and L2 may be moved in accordance with numerical values input from the operation unit 14. The widths of the sliders L1 and L2 of the respective slider bars, which represent the ranges of numerical values that can be specified by the sliders L1 and L2, may be changeable in accordance with drag operations by the operation unit 14 or numerical values input from the operation unit 14. For example, in a case where 1 μm is specified as the width represented by the slider L1, the position of the slider L1 is assumed to be the reference, and only possible defects within a range of ±0.5 μm need to be displayed on the display unit 18. Note that, in a case of changing the widths of the sliders L1 and L2 by drag operations, numerical values representing the widths of the sliders L1 and L2 may be updated and displayed in conjunction with the drag operations.

FIGS. 7A to 7D illustrate changes in display when the sliders are moved. In the example illustrated in FIG. 7A, the slider L1 is moved to a position at which the number of detected possible defects reaches its peak in the histogram H1, and the slider L2 is moved to a position at which the number of detected possible defects reaches its peak in the histogram H2. When the slider L1 is moved to the position at which the number of detected possible defects reaches its peak, a portion in which a large number of possible defects are detected, that is, a portion in which defects seem to frequently occur, can be identified. When the slider L2 is moved to the position at which the number of detected possible defects reaches its peak, an image interpreter can estimate the size of defects that frequently occur.

Figure 7A:
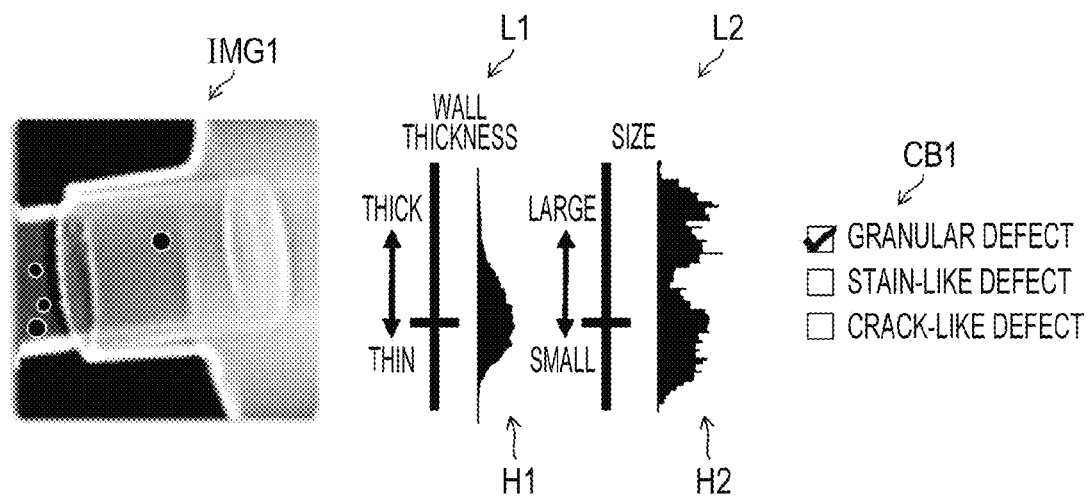
FIG. 7A is a diagram illustrating example display control (display target change) according to an embodiment of the present invention.
Figure 7B:
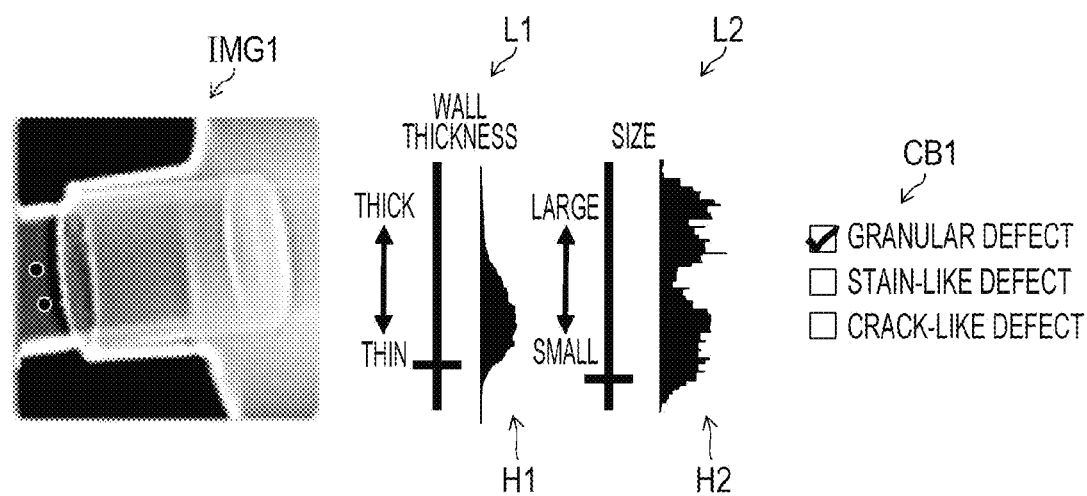
FIG. 7B is a diagram illustrating example display control (display target change) according to an embodiment of the present invention.

In the example illustrated in FIG. 7B, the sliders L1 and L2 are set so as to display images of possible defects having a relatively small size and detected in portions having a relatively small wall thickness in the test object OBJ.

Figure 7C:
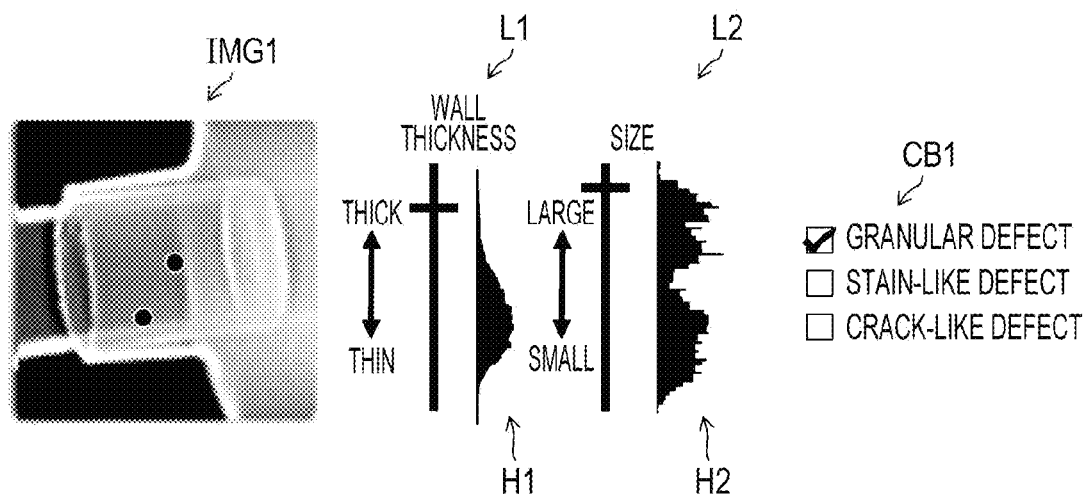
FIG. 7C is a diagram illustrating example display control (display target change) according to an embodiment of the present invention.

In the example illustrated in FIG. 7C, the sliders L1 and L2 are set so as to display images of possible defects having a relatively large size and detected in portions having a relatively large wall thickness in the test object OBJ.

Figure 7D:
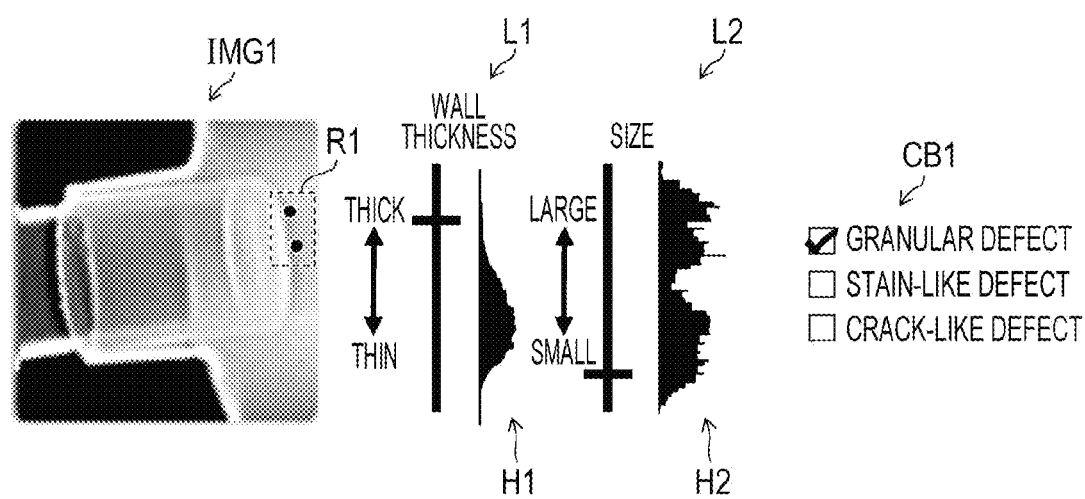
FIG. 7D is a diagram illustrating example display control (display target change) according to an embodiment of the present invention.

In the example illustrated in FIG. 7D, the sliders L1 and L2 are set so as to display images of possible defects having a relatively small size and detected in portions having a relatively large wall thickness in the test object OBJ. In the example illustrated in FIG. 7D, the outline R1, which indicates an inspection area specified in the inspection area specification information, is displayed. Accordingly, an image interpreter can recognize the inspection area specified in advance as a portion in which the possibility of defect occurrence is relatively high.

Figure 8A:
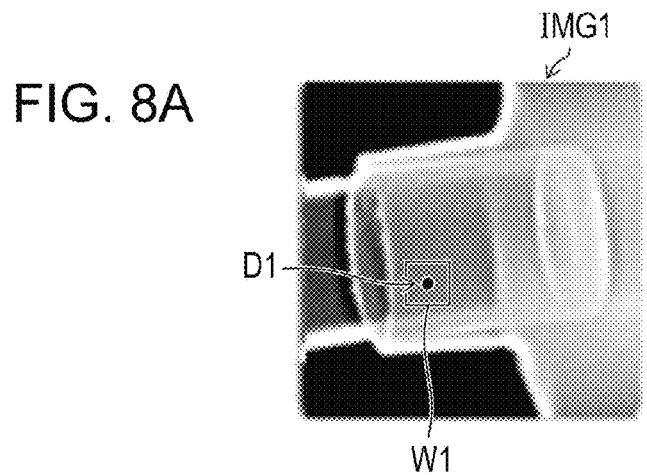
FIG. 8A is a diagram illustrating example display control (display area change) according to an embodiment of the present invention.
Figure 8B:
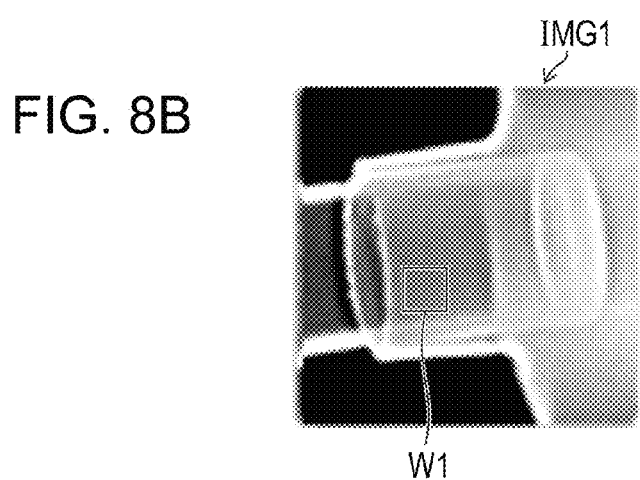
FIG. 8B is a diagram illustrating example display control (display area change) according to an embodiment of the present invention.
Figure 8C:
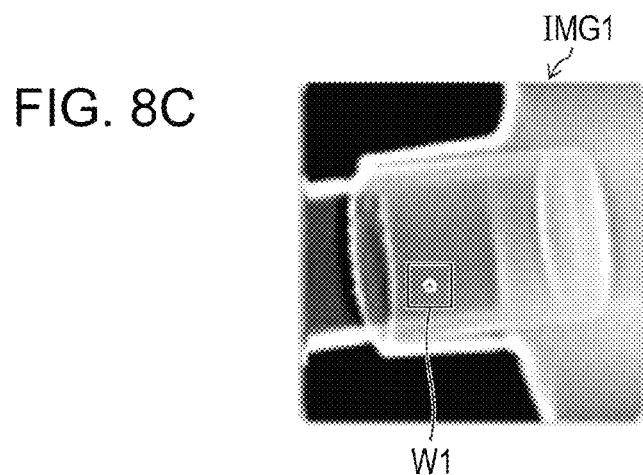
FIG. 8C is a diagram illustrating example display control (display area change) according to an embodiment of the present invention.

FIGS. 8A to 8C are diagrams illustrating example display control (display area change) according to an embodiment of the present invention.

In the example illustrated in FIG. 8A, the partial enlargement window W1 is displayed on the test object image IMG1, and the possible-defect image D1 is displayed only within the partial enlargement window W1. The partial enlargement window W1 can be moved by the operation unit 14.

In the example illustrated in FIG. 8B, a possible-defect image displayed within the partial enlargement window W1 is erased by the operation unit 14. Accordingly, an image interpreter can observe in detail the image of the area enlarged by the partial enlargement window W1.

In the example illustrated in FIG. 8C, a possible-defect image displayed within the partial enlargement window W1 is erased, and the shades of the image within the partial enlargement window W1 are converted to a hue map. Accordingly, changes in color that are difficult to observe in the image before conversion can be read.

Figure 9:
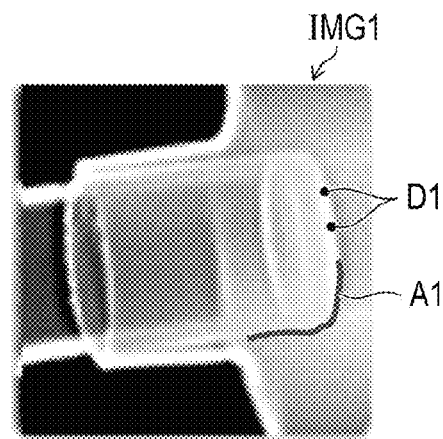
FIG. 9 is a diagram illustrating example display of a defect detection portion in which defects were detected in the past in, for example, an industrial product.
Figure 10:
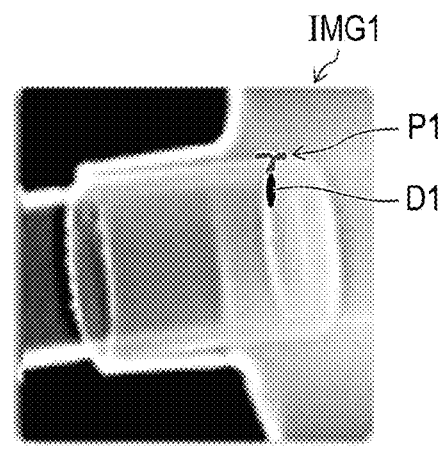
FIG. 10 is a diagram illustrating example display of the predicted growth of a defect.

FIG. 9 is a diagram illustrating example display of a defect detection portion in which defects were detected in the past in, for example, an industrial product. FIG. 10 is a diagram illustrating example display of the predicted growth of a defect.

In the example illustrated in FIG. 9, the inspection area image A1, which represents an inspection area, is displayed together with the possible-defect images D1. The inspection area is based on the inspection area specification information in the product data D200 and is specified on the basis of information (for example, information collected by a support center of the manufacturer) regarding the history of portions in which defects were detected in the past and the frequency in the same industrial product or an industrial product of the same type.

In the example illustrated in FIG. 10, together with the possible-defect image D1, the simulation result image P1 representing the predicted growth of the possible defect is displayed.

The possible-defect image D1, the inspection area image A1, and the simulation result image P1 can be selectively displayed in accordance with an operation input from the operation unit 14. That is, a display target can be selected from among the possible-defect image D1, the inspection area image A1, and the simulation result image P1 and, for example, GUIs, such as checkboxes, for selecting one or more display targets may be provided.

Here, in order to specify an inspection area, not only inspection area specification information regarding the same product but also inspection area specification information regarding an industrial product having the same or a similar technical classification (for example, part of the technical classification is the same) may be used. Accordingly, a specified scope of the inspection area can be enlarged by taking into consideration the occurrence of defects in a similar industrial product in the past, and therefore, defects can be detected with increased precision.

Note that, in a case of creating a simulation result, it is preferable to use only inspection area specification information of the same product without taking into consideration a similar industrial product.

Figure 11:
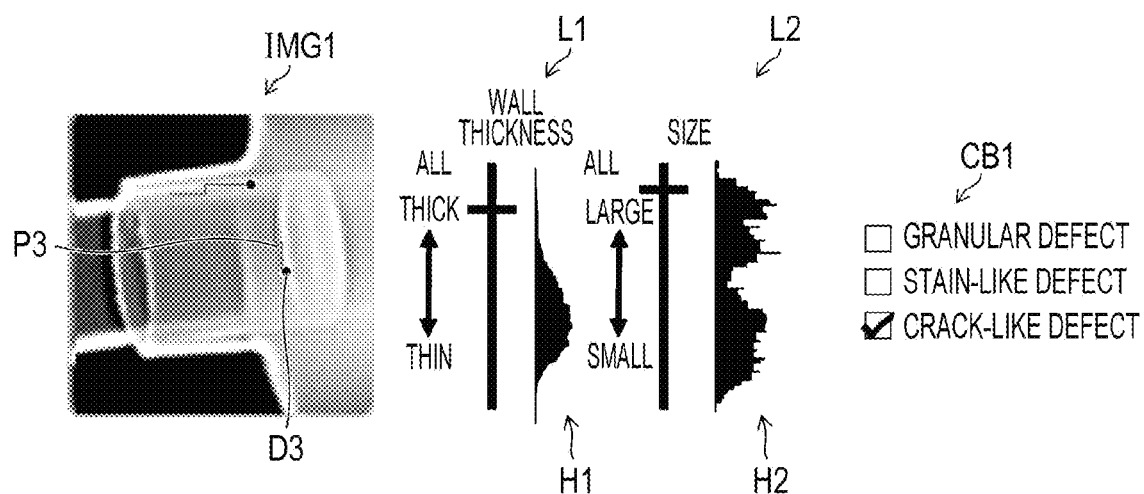
FIG. 11 is a diagram illustrating example display control (simulation result display change) according to an embodiment of the present invention.
Figure 12:
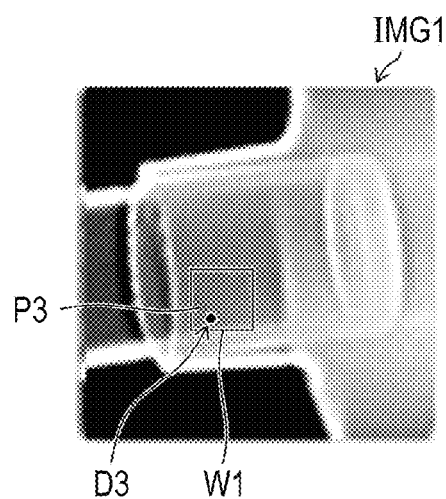
FIG. 12 is a diagram illustrating example display control (simulation result display change) according to an embodiment of the present invention.

FIG. 11 and FIG. 12 are diagrams illustrating example display control (simulation result display change) according to an embodiment of the present invention.

In this embodiment, the sliders L1 and L2 and the checkboxes CB1 are used to enable selection of possible defects and simulation results to be displayed. An image interpreter can select one or more types of possible defects to be displayed by using the checkboxes CB1 and can select possible defects to be displayed on the basis of the wall thickness of a portion in which possible defects are detected and the size of possible defects by using the sliders L1 and L2. Here, targets to be displayed may be selected by using the values of the wall thickness and size at the time of imaging or by using the degree of decrease in the wall thickness or the value of the size based on the predicted growth of possible defects.

In the example illustrated in FIG. 11, the possible-defect image D3 of a crack-like defect and the simulation result image P3, which represents the predicted growth of the crack-like defect, are displayed.

The example illustrated in FIG. 12 is example display using the partial enlargement window W1. In the example illustrated in FIG. 12, only the possible-defect image D3 and the simulation result image P3 within the partial enlargement window W1 are displayed.

The partial enlargement window W1 can be moved and enlarged/reduced by an operation input form the operation unit 14. Accordingly, an image interpreter can specify a scope that is to be enlarged and displayed. The displayed possible-defect image D3 or simulation result image P3 can be erased (turned off) by an operation input from the operation unit 14, and therefore, the image of the current test object OBJ can be checked.

Defect Inspection Method

Figure 13:
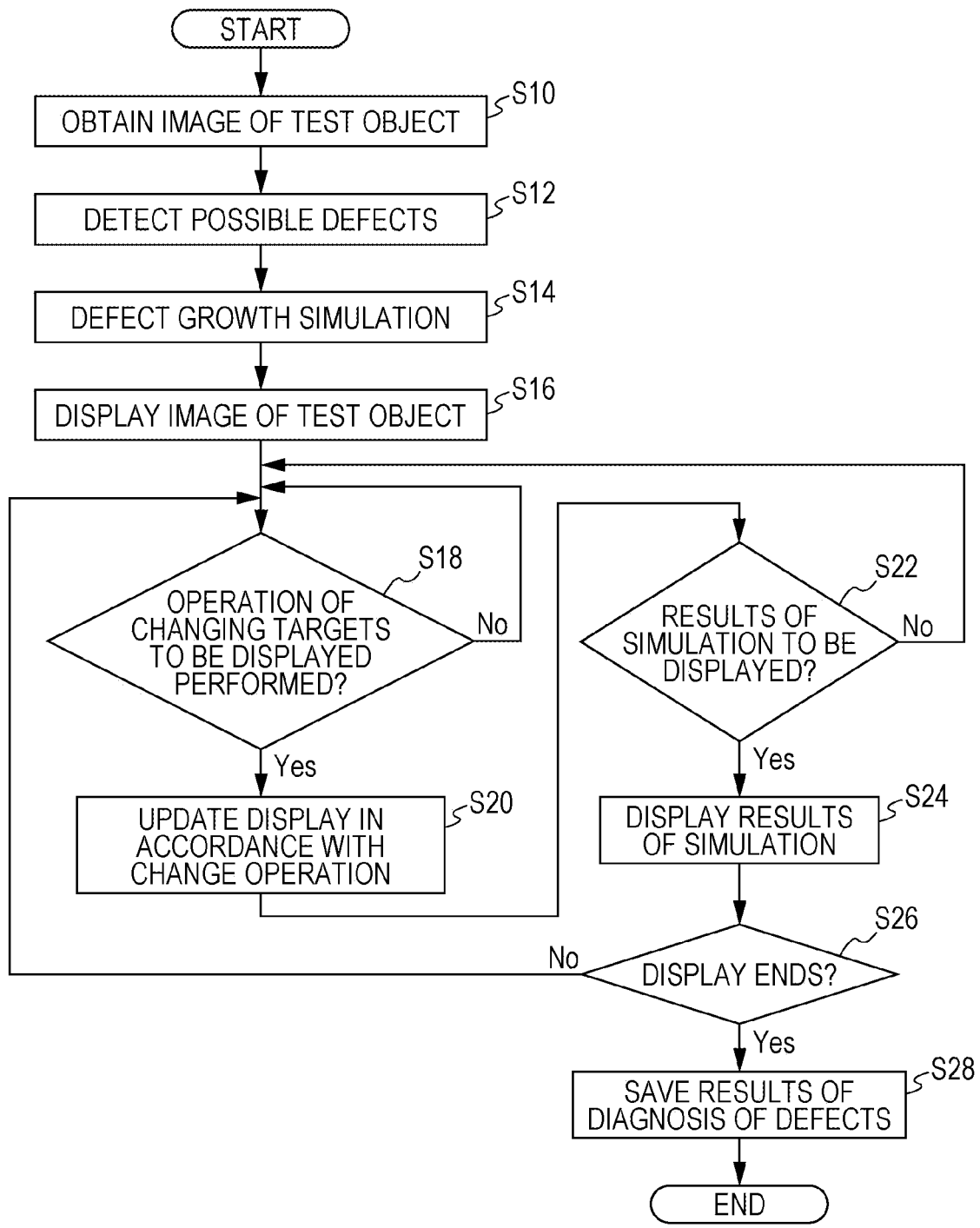
FIG. 13 is a flowchart illustrating display control in a defect inspection method according to an embodiment of the present invention.

FIG. 13 is a flowchart illustrating display control in a defect inspection method according to an embodiment of the present invention.

First, the defect inspection apparatus 10 obtains the test object imaging data D100 including an image (captured image data) of a test object from the imaging system 100 via the I/F 16 (step S10: image obtaining step). The image processing unit 22 performs image processing on the captured image data obtained in step S10 to detect possible defects (step S12: image processing step).

Next, the simulation processing unit 26 performs a calculation to predict the growth of each of the possible defects detected in step S12 (step S14: simulation step).

The control unit 12 creates a display image on the basis of the captured image data obtained in step S10, the results of detection of possible defects in step S12, and the results of simulation in step S14 and outputs the display image to the display unit 18. Accordingly, the test object image IMG1 to which possible-defect images are added is displayed on the display unit 18 (step S16: display step). In step S16, the possible defects and the results of simulation (defect growth prediction) are displayed so as to be distinguishable from each other. For example, the possible defects and the results of simulation may be color-coded and displayed or, for example, marks with which the possible defects can be distinguished from the results of simulation may be added.

Next, if the control unit 12 accepts a change operation of changing targets to be displayed via GUIs, such as the checkboxes CB1 and the sliders L1 and L2 (Yes in step S18), the control unit 12 updates display on the display unit 18 in accordance with the change operation (step S20: display control step). For example, in a case where the slider L1 for the wall thickness is operated, only possible defects in parts having a wall thickness that is within a range specified by the slider L1 are displayed.

If the control unit 12 accepts an instruction for displaying the results of simulation via the operation unit 14 (Yes in step S22), the control unit 12 causes the results of simulation to be displayed on the display image (step S24: display control step).

If the inspection by the image interpreter ends and an instruction for ending display is input by the operation unit 14 (Yes in step S26), the results of simulation are included in the test object inspection result data D10 as the simulation result data, the results of diagnosis of defects are included in the test object inspection result data D10 as the diagnosis result data, and the data is recorded to the recording unit 24 (step S28: saving step).

According to this embodiment, the result of simulation for predicting the growth of each possible defect detected by the image processing unit 22 can be displayed, and GUIs for performing operations to interactively change results of simulation regarding the growth of possible defects to be displayed, the simulation being performed for each of the possible defects, can be provided. According to this embodiment, an image interpreter can check the occurrence of possible defects and information regarding growth and spreading thereof over time on a screen on the basis of, for example, the history of defects detected in the past, and therefore, precision and efficiency in image interpretation can be increased, and efforts made by the image interpreter can be reduced.

Furthermore, according to this embodiment, specification of the ranges of the features of possible defects to be displayed on the display unit 18 can be changed continuously or gradually, and GUIs for operations of interactively changing possible defects to be displayed can be provided. Accordingly, the effects of the experience and capability of an image interpreter on precision and efficiency in defect detection can be reduced, and a very small defect or a very small change in hue that an image interpreter usually has difficulty in detecting can be precisely and efficiently detected, and therefore, precision and efficiency in defect detection can be increased.

When the test object inspection result data D10 including the results of simulation and the results of diagnosis is, for example, stored in the product DB 200 and made available for reference via the network NW, the test object inspection result data D10 can be used not only by the defect inspection apparatus 10 but also by a production section of the manufacturer as data for increasing the quality of the industrial product and increasing inspection efficiency.

The present invention can be implemented as a program (defect inspection program) for causing a computer to implement the above-described processing or as a non-transitory recording medium or a program product in which such a program is stored. When such a defect inspection program is applied to a computer, arithmetic means, recording means, and so on of the computer can be caused to function as an image obtaining function, an image processing function, a saving function, a simulation function, and a display control function of the defect inspection program.

REFERENCE SIGNS LIST 10 defect inspection apparatus
12 control unit
14 operation unit
16 input/output interface (I/F)
18 display unit
20 buffer memory
22 image processing unit
24 recording unit
26 simulation processing unit
220 possible-defect detection unit
222 measurement unit
S10 to S28 each step in display control

What is claimed is:

1. A defect inspection apparatus comprising:
an interface that obtains a received-light image created on the basis of reflected light or transmitted light from a test object, the reflected light or the transmitted light being obtained as a result of irradiation of the test object with light rays or radiation rays;
a processor configured to calculate a position and a feature of possible defects in the test object from the received-light image, the possible defects comprising at least one of a thickness defect, a granular defect, a stain defect, a crack, dust, rust, and chipping;
a saving unit that saves a calculation result, which includes the position and the feature of each of the possible defects occurring in the test object, obtained by the processor and a diagnosis result indicating whether or not each of the possible defects occurring in the test object corresponding to the calculation result is an actual defect;
wherein the processor is further configured to analyze an occurrence and growth of the-each of the possible defects occurring in the test object over time from the calculation result saved on the saving unit and the diagnosis result saved on the saving unit, and is further configured to conduct a simulation for predicting growth of the each of the possible defects occurring in the test object;
a display unit that displays the received-light image; and
a display control unit that causes the calculation result and a simulation result to be selectively overlay displayed on the received-light image, and
wherein the processor analyzes the occurrence and the growth of the each of the possible defects occurring in the test object over time from a product calculation result and a product diagnosis result, said product calculation result and the product diagnosis result corresponding to a product of a type identical to a type of the test object, in addition to the calculation result and the diagnosis result corresponding to the test object, and conducts the simulation.

2. The defect inspection apparatus according to claim 1, wherein
the diagnosis result includes at least one of an inspection date and time or a material of the test object, a type, a form, a magnitude, a depth, or a site of occurrence of the defect, or an image of the defect.

3. The defect inspection apparatus according to claim 1, wherein the processor is configured to output a message to describe whether the test object should be replaced, the test object should be monitored, or the each of the possible defects occurring in the test object is not an actual defect.

4. The defect inspection apparatus according to claim 1, wherein
the interface further obtains defect occurrence information indicating occurrences of defects in the past in the test object, wherein
the display control unit causes the defect occurrence information to be selectively displayed on the received-light image in addition to the calculation result and the simulation result.

5. The defect inspection apparatus according to claim 4, wherein
the diagnosis result includes at least one of an inspection date and time or a material of the test object, a type, a form, a magnitude, a depth, or a site of occurrence of the defect, or an image of the defect.

6. The defect inspection apparatus according to claim 4, wherein the processor further operates as
an operation unit that accepts an operation of continuously or gradually changing specification of a range of the features of the possible defects occurring in the test object to be displayed on the display unit, and causes, in accordance with the operation, only the possible defects occurring in the test object that fall within the range of the features among the possible defects is displayed on the received-light image displayed on the display unit.

7. The defect inspection apparatus according to claim 6, wherein
the diagnosis result includes at least one of an inspection date and time or a material of the test object, a type, a form, a magnitude, a depth, or a site of occurrence of the defect, or an image of the defect.

8. The defect inspection apparatus according to claim 4, wherein
the interface obtains defect occurrence information that corresponds to a product of a type identical to a type of the test object and defect occurrence information that corresponds to a product having a technical classification similar to a technical classification of the test object in addition to the defect occurrence information corresponding to the test object, and
the display control unit causes the obtained defect occurrence information to be selectively displayed on the received-light image.

9. The defect inspection apparatus according to claim 8, wherein
the diagnosis result includes at least one of an inspection date and time or a material of the test object, a type, a form, a magnitude, a depth, or a site of occurrence of the defect, or an image of the defect.

10. The defect inspection apparatus according to claim 8, wherein the processor further operates as an operation unit that accepts an operation of continuously or gradually changing specification of a range of the features of the possible defects occurring in the test object to be displayed on the display unit, and causes, in accordance with the operation, only the possible defects occurring in the test object that fall within the range of the features among the possible defects is displayed on the received-light image displayed on the display unit.

11. The defect inspection apparatus according to claim 4, wherein the interface obtains the defect occurrence information, which includes position information regarding portions in which the defects occurred in the past and frequency information regarding a defect occurrence frequency in each of the portions, and the display control unit causes the frequency information to be displayed on the received-light image in a case of displaying the defect occurrence information.

12. The defect inspection apparatus according to claim 11, wherein the processor further operates as an operation unit that accepts an operation of continuously or gradually changing specification of a range of the features of the possible defects occurring in the test object to be displayed on the display unit, and causes, in accordance with the operation, only the possible defects occurring in the test object that fall within the range of the features among the possible defects is displayed on the received-light image displayed on the display unit.

13. The defect inspection apparatus according to claim 11, wherein the diagnosis result includes at least one of an inspection date and time or a material of the test object, a type, a form, a magnitude, a depth, or a site of occurrence of the defect, or an image of the defect.

14. The defect inspection apparatus according to claim 11, wherein the interface obtains defect occurrence information that corresponds to a product of a type identical to a type of the test object and defect occurrence information that corresponds to a product having a technical classification similar to a technical classification of the test object in addition to the defect occurrence information corresponding to the test object, and the display control unit causes the obtained defect occurrence information to be selectively displayed on the received-light image.

15. The defect inspection apparatus according to claim 14, wherein the diagnosis result includes at least one of an inspection date and time or a material of the test object, a type, a form, a magnitude, a depth, or a site of occurrence of the defect, or an image of the defect.

16. The defect inspection apparatus according to claim 1, wherein the processor further operates as an operation unit that accepts an operation of continuously or gradually changing specification of a range of the features of the possible defects occurring in the target object to be displayed on the display unit, and causes, in accordance with the operation, only possible defects occurring in the test object that fall within the range of features among the possible defects is displayed on the received-light image displayed on the display unit.

17. The defect inspection apparatus according to claim 16, wherein the diagnosis result includes at least one of an inspection date and time or a material of the test object, a type, a form, a magnitude, a depth, or a site of occurrence of the defect, or an image of the defect.

18. The defect inspection apparatus according to claim 16, wherein the operation unit causes the display unit to display, for each of the features of the possible defects occurring in the test object, a slider bar for displaying a result of specification for the feature, and accepts an operation of moving a slider on the slider bar to thereby continuously or gradually change specification of the feature range.

19. The defect inspection apparatus according to claim 18, wherein the display unit displays a frequency distribution indicating a detection frequency for each of the features of the possible defects occurring in the test object in association with the slider bar.

20. A defect inspection method comprising:

using one or more processors to perform:

an image obtaining step that obtains a received-light image created on the basis of reflected light or transmitted light from a test object, the reflected light or the transmitted light being obtained as a result of irradiation of the test object with light rays or radiation rays;

an image processing step that calculates a position and a feature of possible defects in the test object from the received-light image, the possible defects comprising at least one of a thickness defect, a granular defect, a stain defect, a crack, dust, rust, and chipping;

a saving step that saves, on saving unit of a defect inspection apparatus, a calculation result, which includes the position and the feature of each of the possible defects occurring in the test object, obtained in the image processing step and a diagnosis result indicating whether or not the each of the possible defects occurring in the test object is an actual defect in association with the calculation result;

a simulation step that analyzes an occurrence and growth of the each of the possible defects occurring in the test object over time from the calculation result obtained in the image processing step and saved on the saving unit and the diagnosis result saved on the saving unit, and conducts a simulation for predicting growth of the each of the possible defects occurring in the test object; and a display control step that causes the calculation result obtained in the image processing step and a simulation result obtained in the simulation step to be selectively overlay displayed on the received-light image displayed on display unit of the defect inspection apparatus, and wherein the simulation step analyzes the occurrence and growth of the each of the possible defects occurring in the test object over time from a product calculation result and a product diagnosis result, said product calculation result and said product diagnosis result corresponding to a product of a type identical to a type of the test object, in addition to the calculation result and the diagnosis result corresponding to the test object, and conducts the simulation.

21. A non-transitory computer readable recording medium storing a defect inspection program causing a computer to execute:

an image obtaining function that obtains a received-light image created on the basis of reflected light or transmitted light from a test object, the reflected light or the transmitted light being obtained as a result of irradiation of the test object with light rays or radiation rays;
an image processing function that calculates a position and a feature of possible defects in the test object from the received-light image, the possible defects comprising at least one of a thickness defect, a granular defect, a stain defect, a crack, dust, rust and chipping;
a saving function that saves a calculation result, which includes the position and the feature of each of the possible defects occurring in the test object, obtained by the image processing function and a diagnosis result indicating whether or not each of the possible defects occurring in the test object is an actual defect in association with the calculation result;
a simulation function that analyzes an occurrence and growth of the each of the possible defects occurring in the test object over time from the saved calculation result and the saved diagnosis result, and conducting a simulation for predicting growth of the each of the possible defects occurring in the test object; and
a display control function that causes the calculation result and a simulation result obtained by the simulation function to be selectively displayed on the received-light image, and
wherein the simulation function analyzes the occurrence and growth of the each of the possible defects occurring in the test object over time from a product calculation result and a product diagnosis result, said product calculation result and the product diagnosis result corresponding to a product of a type identical to a type of the test object in addition to the calculation result and the diagnosis result corresponding to the test object, and conducts the simulation.

\* \* \* \* \*